US 6,573,180 B2
Jun. 3, 2003

(12) United States Patent
Won

(54) PECVD METHOD OF FORMING A TUNGSTEN SILICIDE LAYER ON A POLYSILICON LAYER

(75) Inventor: Jai Hyung Won, Seongnam-si (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/101,776

(22) Filed: Mar. 21, 2002

(65) Prior Publication Data

US 2002/0137336 A1 Sep. 26, 2002

(30) Foreign Application Priority Data

Mar. 23, 2001 (KR) .......................... 2001-15225

(51) Int. Cl.[7] ............................................. H01L 21/443
(52) U.S. Cl. ..................... 438/655; 438/680; 438/683
(58) Field of Search .................. 438/655, 656, 438/657, 680, 683, 592

(56) References Cited

U.S. PATENT DOCUMENTS

| 4,692,343 A | * | 9/1987 | Price et al. ............... 427/38 |
| 5,231,056 A | | 7/1993 | Sandhu |
| 5,510,297 A | * | 4/1996 | Telford et al. ............ 437/200 |
| 5,558,910 A | | 9/1996 | Telford et al. |
| 5,946,599 A | * | 8/1999 | Lee et al. ................. 438/683 |
| 6,245,673 B1 | * | 6/2001 | Okubo et al. ............. 438/649 |
| 6,417,565 B1 | | 7/2002 | Komatsu |
| 2001/0008796 A1 | | 7/2001 | Matsudo et al. |
| 2002/0127338 A1 | * | 9/2002 | Saenger ................. 427/255.28 |
| 2002/0137315 A1 | * | 9/2002 | Ahn et al. ................ 438/584 |

FOREIGN PATENT DOCUMENTS

| DE | 100 63 717 C1 | 12/2000 | |
| EP | 0 591 086 A2 | 4/1994 | |
| EP | 0841 690 A1 | 5/1998 | |
| EP | 0860 863 A2 | 8/1998 | |
| EP | 0 932 186 A2 | 7/1999 | |
| JP | 1-76759 A | * 3/1999 | ......... H01L/29/46 |
| KR | 1998-0005677 | 3/1998 | |

OTHER PUBLICATIONS

T.H.T. Wu et al., "Properties of WSix Using Dichlorosilane in a Single–Wafer System," J. Vac. Sci. Technol. B, vol. 6, No. 6, Nov./Dec. 1988, pp. 1707–1713.*
Hosaka, "Tungsten Silicide Film and a Method for Forming Thereof," English translation of JP 64–76759 A, Mar. 1989.*
J. T. Hillman et al., "Characterization of WSix Films Deposited by Reacting WF6 with a Mixture of SiHCl and SiH" J. Electrochem. Soc., vol. 139, No. 12, Dec. 1992, pp. 3574–3578.
J.P. Lu et al., "A New Process for Depositing Tungsten Nitride Thin Films," J. Electrochem. Soc., vol. 145, No. 2, Feb. 1998, pp. L21–L23.

* cited by examiner

*Primary Examiner*—Carl Whitehead, Jr.
*Assistant Examiner*—Stephen W. Smoot
(74) *Attorney, Agent, or Firm*—Volentine Francos, PLLC

(57) ABSTRACT

A semiconductor substrate having a polysilicon layer is loaded into a process chamber of a plasma enhanced chemical vapor deposition device. A silicon source gas, a tungsten source gas, and a hydrogen compound gas for reducing a chlorine radical are introduced into the process chamber, to thereby deposit the tungsten silicide layer on the polysilicon layer. The chlorine radical of the silicon source gas is reduced into hydrogen chloride by the hydrogen compound gas and is removed together with an exhaust gas.

23 Claims, 8 Drawing Sheets

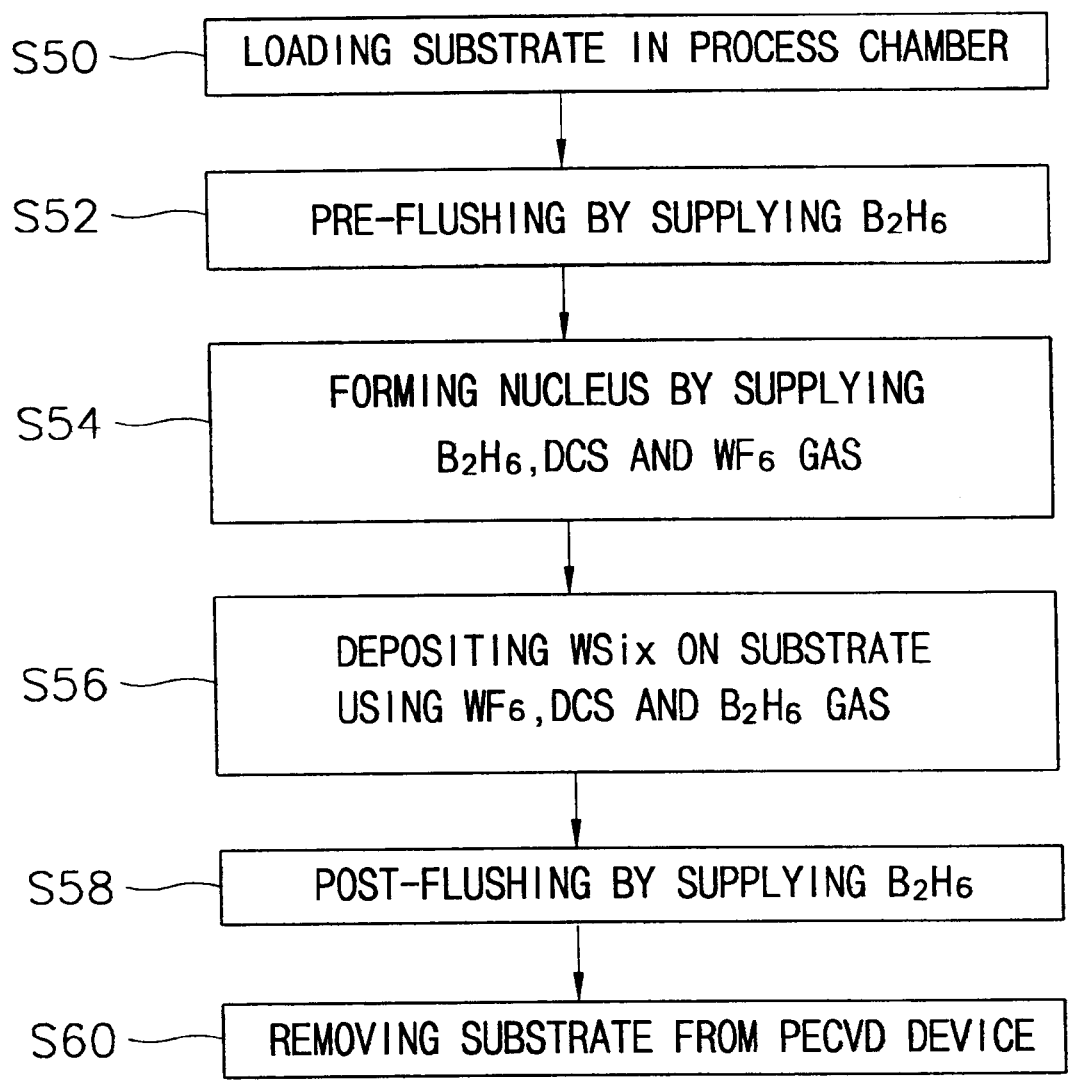

PECVD METHOD OF FORMING A TUNGSTEN SILICIDE LAYER ON A POLYSILICON LAYER

BACKGROUND OF THE INVENTION

1. Field of the Invention

The present invention generally relates to a method for forming a tungsten silicide layer, and more particularly, the present invention relates to a method for depositing a tungsten silicide layer ($WSi_x$) using a tungsten source gas and a silicon source gas containing chlorine.

2. Description of the Related Art

As semiconductor devices become highly integrated, the size of patterns formed on individual chips become smaller and an interval between the patterns becomes narrower. These ultra-fine patterns create problems with the conventional use of polysilicon as a wiring material for a gate electrode and a bit line. That is, as the size of the patterns become smaller, the specific resistivity of polysilicon is increased, which in turn can result in an RC time delay and an IR voltage drop. For this reason, polycide, which has characteristics similar to those of polysilicon but with much smaller specific resistivity (e.g., several times to several tens times smaller) has been suggested as a wiring material for the gate electrode and the bit line of a VLSI circuit. More specifically, a composite layer of polysilicon and a refractory metal silicide has been used as a polycide of wiring electrodes.

Silicides of refractory metals, such as tungsten (W), molybdenum (Mo), titanium (Ti) and tantalum (Ta), have been adapted for use as a low resistive wiring material suitable for manufacturing the VLSI circuit. Silicides are bonded to polysilicon doped with high-density impurities, whereby a gate electrode having a polycide structure is formed. Preferably, a low pressure chemical vapor deposition (LPCVD) method is used for depositing refractory metal silicides. Tungsten silicide, when bonded to polysilicon, exhibits superior characteristics with respect to self-passivation, stability against wet chemicals, surface roughness, adhesion, anti-oxidation and reproducibility.

Tungsten silicide ($WSi_x$) thin films are formed using monosilane ($SiH_4$) and tungsten hexafluoride ($WF_6$) as a precursor gas and are deposited on semiconductor substrates by LPCVD. However, certain drawbacks are associated with the LPCVD process. One such drawback is that tungsten silicide cannot be conformally deposited on a stepped portion of a substrate. Another drawback is that a substantial amount of fluorine remains in the deposited tungsten silicide thin film, which in turn can result in operational defects in the manufactured semiconductor device. That is, when the semiconductor wafer is later exposed to a temperature exceeding 850° C. during an anneal process, the remaining fluorine ions move into a lower silicon oxide layer through a polysilicon layer. An effective thickness of the silicon oxide layer is thus increased, resulting in inconsistent electric characteristics of the semiconductor device having the silicon oxide layer.

For this reason, it has been suggested to deposit the tungsten silicide layer using dichlorosilane (DCS; $SiH_2Cl_2$) instead of monosilane. A tungsten silicide layer which has been deposited using dichlorosilane (hereinafter, referred to as a "DCS tungsten silicide layer") exhibits superior step coverage and low fluorine content as compared with a tungsten silicide layer which has been deposited using monosilane (hereinafter, referred to as a "MS tungsten silicide layer").

In view of its advantages, the DCS tungsten silicide layer has been preferred over the MS tungsten silicide layer as the wiring material for a word line (that is, gate electrode) and a bit line. However, the DCS tungsten silicide layer is not without its drawbacks. That is, various problems result from the fact that when the dichlorosilane gas is reacted with tungsten hexafluoride ($WF_6$) gas, chlorine radicals remain on a surface and an inner portion of a thin film.

FIG. 1 is a flow chart showing a conventional method for depositing a DCS tungsten silicide layer.

Referring to FIG. 1, a silicon wafer, that is, a semiconductor substrate having a polysilicon layer at an uppermost region thereof is loaded in a process chamber of a plasma-enhanced chemical vapor deposition (PECVD) apparatus (step S1). Then, tungsten hexafluoride ($WF_6$) gas and dichlorosilane ($SiH_2Cl_2$) gas are introduced into the process chamber to form a tungsten silicide nucleus on a surface of the polysilicon layer (step S3). Then, under reaction conditions of a pressure of about 1 to 1.5 Storr, a deposition time of 10 to 25 seconds, and a temperature of 450 to 700° C., tungsten hexafluoride ($WF_6$) gas and dichlorosilane ($SiH_2Cl_2$) gas are introduced into the process chamber in a ratio of about 13:180. As a result, a tungsten silicide layer is deposited on the surface of the polysilicon layer having the tungsten silicide nucleus (step S5). Then, a post-flushing process is carried out for about 10 seconds to reduce stress by introducing a monosilane ($SiH_4$) gas into the process chamber (step S7) at flow rate of about 300 sccm.

FIG. 2A is a graph showing a chlorine profile in the tungsten silicide layer and the polysilicon layer when the DCS tungsten silicide layer has been deposited, and FIG. 2B is a graph showing a chlorine profile in the tungsten silicide layer and the polysilicon layer after an annealing process has been carried out.

Generally, the DCS tungsten silicide layer is deposited at a temperature of 620° C., which is about 200° C. higher than a deposition temperature of the MS tungsten silicide layer. Also, the DCS tungsten silicide layer exhibits a columnar structure in which a hexagonal phase and a tetrahedral site co-exist. In addition, the DCS tungsten silicide layer has a body-centered cubic structure in which a covalent bond is formed between one tungsten atom and eight silicon atoms. Excess silicon, which is not involved in the covalent bond, acts as a stacking fault. Silicon, which acts as the stacking fault, is bonded to chlorine dissociated from dichlorosilane gas, thereby forming a silicon chloride crystal. Chlorine breaks Si—H and Si—Si bonds so as to be bonded to silicon and excess silicon is re-bonded to chlorine because of the bond strength differences. Therefore, as shown in FIG. 2A, chlorine is diffused from the tungsten silicide layer into the underlying polysilicon layer as the result of a domino phenomenon of continuous dissociation and crystal-bonding, so that chlorine in the form of $SiCl_x$ crystals is concentrated on an interfacial surface between the tungsten silicide layer and the polysilicon layer.

In addition, after the anneal process has been carried out at a temperature of about 800° C., the tungsten silicide layer has a stable stoichiometry due to the tetrahedral site crystalline structure, whereby an amount of chlorine considered as $SiCl_x$ crystals increases in a region of the polysilicon layer which has a relatively sufficient amount of silicon (referred to FIG. 2B).

As described above, according to the conventional DCS tungsten deposition method, a substantial amount of $SiCl_x$ crystal remains in the thin film and a surface of the polysilicon layer, whereby a Milky Way phenomenon (that is, a collection of twinkling points viewed in an optical microscope) occurs which is caused by a scattering of light due to the $SiCl_x$ crystal, thereby resulting a visual defect. The visual defect affects subsequent photolithography processes, making it difficult to carry out such photolithography processes.

In addition, the chlorine atoms contained in the DCS tungsten silicide layer and the polysilicon layer diffuse into an inside of the silicide layer in the form of $SiCl_x$ crystals, and as a result, the polysilicon layer is abnormally grown.

That is, while the crystallization temperature of the polysilicon layer is about 530 to 550° C., the polysilicon layer is initially deposited in an amorphous state and crystallization of the polysilicon layer is carried out in the process chamber at a temperature of about 620° C. when the DCS tungsten silicide layer is deposited. At this time, excess silicon contained in the DCS tungsten silicide layer is bonded to chlorine to form the $SiCl_x$ crystal. In this state, the $SiCl_x$ crystal diffuses from the tungsten silicide layer into the underlying polysilicon layer as a result of the domino phenomenon of continuous dissociation and crystal-bonding. Due to the $SiCl_x$ crystals, silicon dissociated from Si—Si bond or Si—H bond diffuses towards the polysilicon layer, thereby causing growth and crystallization of the polysilicon layer. In particular, the monosilane post-flushing process, which is carried out after the DCS tungsten silicide layer is deposited, continuously supplies excess silicon into the tungsten silicide layer. Therefore, after the DCS tungsten silicide layer deposition process and the monosilane post-flushing process have been finished, the growth and crystallization of the polysilicon layer in the amorphous state occurs locally from the diffusion of excess silicon. Accordingly, the polysilicon layer protrudes through the tungsten silicide layer formed thereon, thereby resulting a crack known as a "haze phenomenon".

SUMMARY OF THE INVENTION

According to one aspect of the present invention, there is provided a method of forming a tungsten silicide layer, which includes loading a semiconductor substrate having a polysilicon layer into a process chamber of a plasma enhanced chemical vapor deposition device, and introducing a silicon source gas, a tungsten source gas, and a hydrogen compound gas for reducing a chlorine radical into the process chamber, to thereby deposit the tungsten silicide layer on the polysilicon layer.

According to another aspect of the present invention, there is provided a method for forming a tungsten silicide layer, which includes loading a semiconductor substrate having a polysilicon layer into a process chamber of a plasma enhanced chemical vapor deposition device, pre-flushing a surface of the polysilicon layer by introducing a hydrogen compound gas for reducing a chlorine radical into the process chamber, introducing a silicon source gas, a tungsten source gas and the hydrogen compound gas into the process chamber so as to form a tungsten silicide nucleus on the surface of the polysilicon layer, and introducing the silicon source gas and the tungsten source gas into the process chamber so as to deposit the tungsten silicide layer on the polysilicon layer.

According to still another aspect of the present invention, there is provided a method for forming a tungsten silicide layer, which includes loading a semiconductor substrate having a polysilicon layer into a process chamber of a plasma enhanced chemical vapor deposition device, pre-flushing a surface of the polysilicon layer by introducing a hydrogen compound gas for reducing a chlorine radical into the process chamber, introducing a silicon source gas, a tungsten source gas and the hydrogen compound gas into the process chamber so as to form a tungsten silicide nucleus on the surface of the polysilicon layer, and introducing the silicon source gas, the tungsten source gas, and the hydrogen compound gas into the process chamber so as to deposit the tungsten silicide layer on the polysilicon layer.

According to the present invention, when the tungsten silicide layer is deposited on the polysilicon layer by introducing, for example, a tungsten hexafluoride ($WF_6$) gas and a dichlorosilane ($Si_2HCl_2$) gas into the process chamber, a hydrogen compound gas such as $B_2H_6$, $PH_3$, $AsH_3$ and/or $NH_3$ is also introduced into the process chamber. As a result, a chlorine radical dissociated from the dichlorosilane gas by the hydrogen compound is reduced into hydrogen chloride (HCl) and is removed together with an exhaust gas. Accordingly, visual defects caused by $SiCl_x$ crystals and abnormal growth of the polysilicon layer may be avoided.

BRIEF DESCRIPTION OF THE DRAWINGS

The above and other aspects and advantages of the present invention will become more readily apparent from the detailed description that follows, with reference to the accompanying drawings, in which:

FIG. 7 is a graph of a method for depositing a tungsten silicide layer according to the third embodiment of the present invention.

DETAILED DESCRIPTION OF THE PREFERRED EMBODIMENTS

Figure 1:
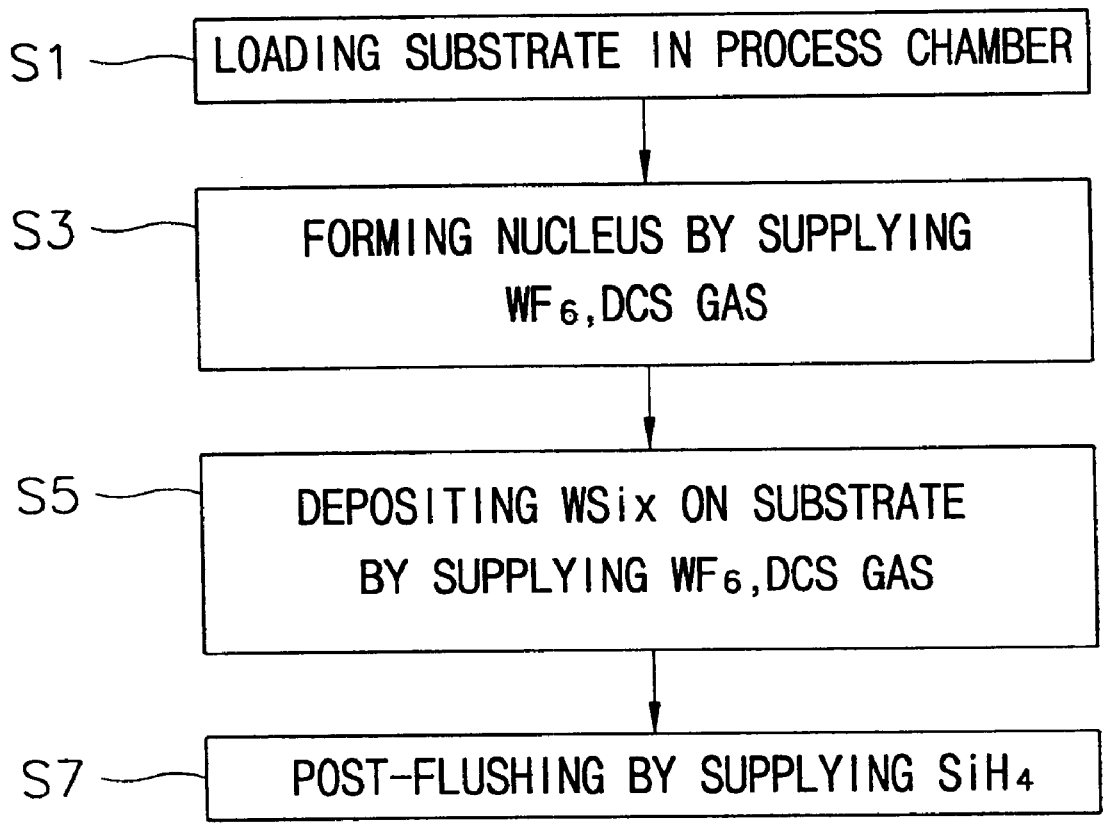
FIG. 1 is a flow chart of a conventional process for depositing a DCS tungsten silicide layer.
Figure 2A:
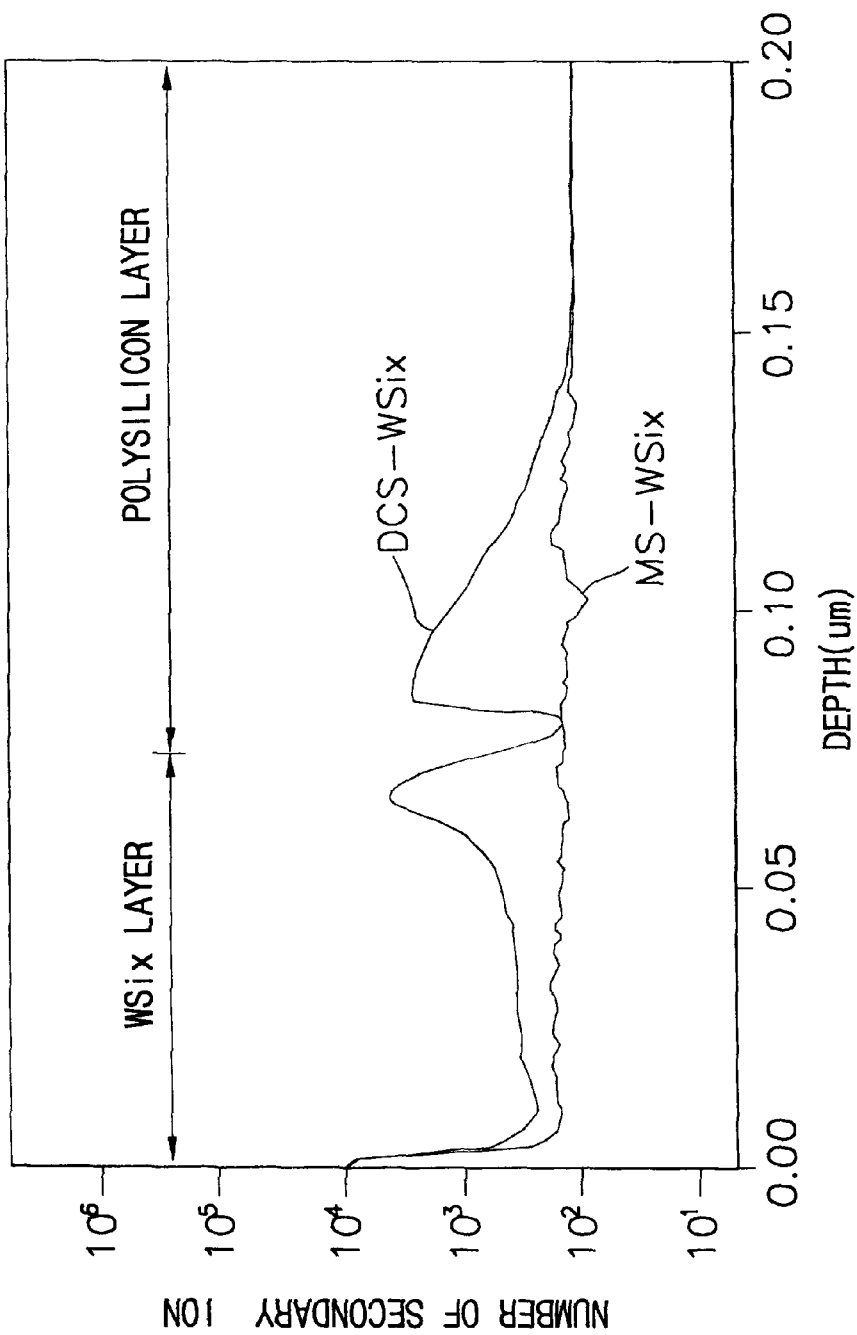
FIG. 2A is a graph showing a chlorine profile in a tungsten silicide layer and a polysilicon layer when the DCS tungsten silicide layer is deposited in the conventional manner.
Figure 2B:
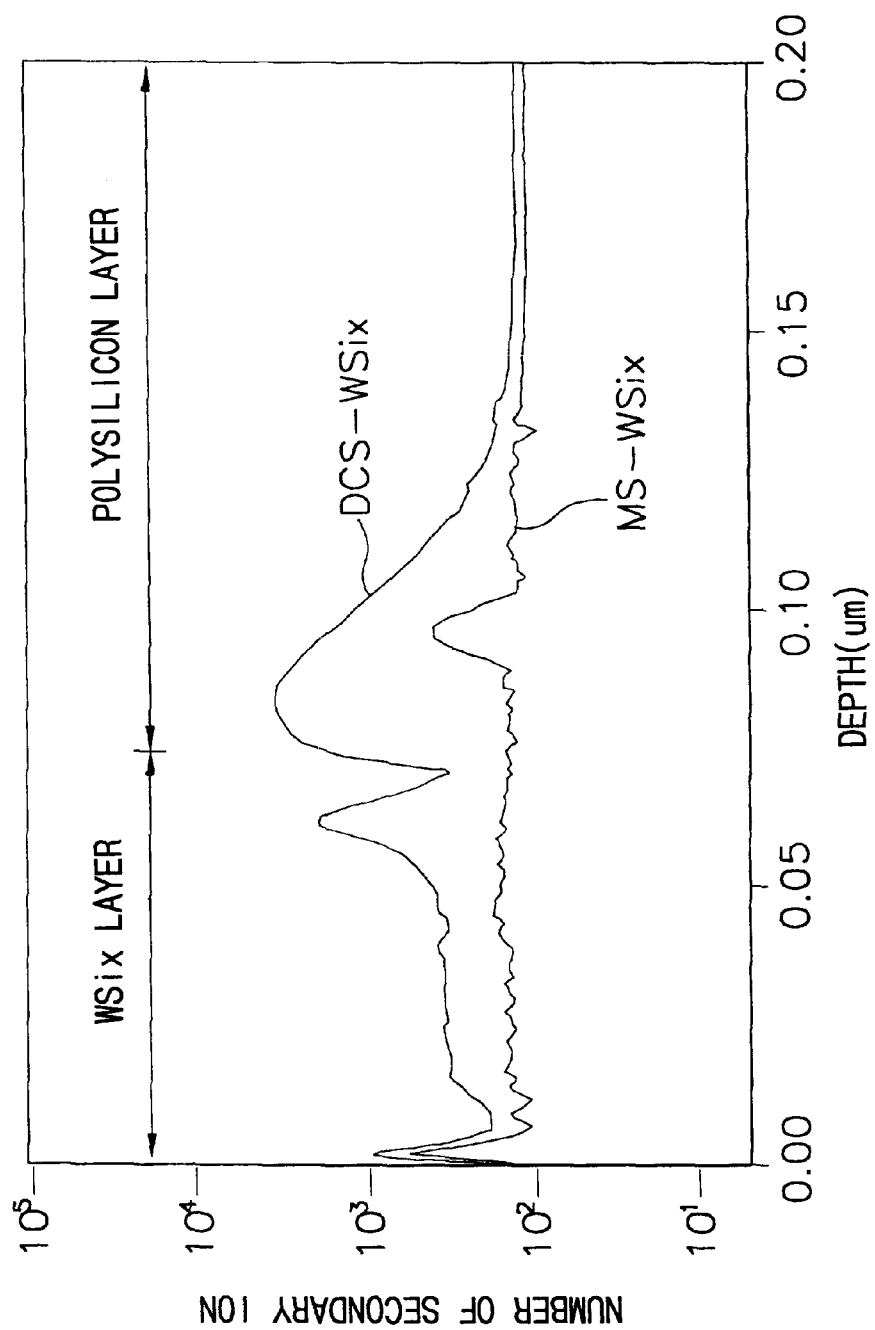
FIG. 2B is a graph showing a chlorine profile in a tungsten silicide layer and a polysilicon layer after an anneal has been carried out in the conventional process.
Figure 3:
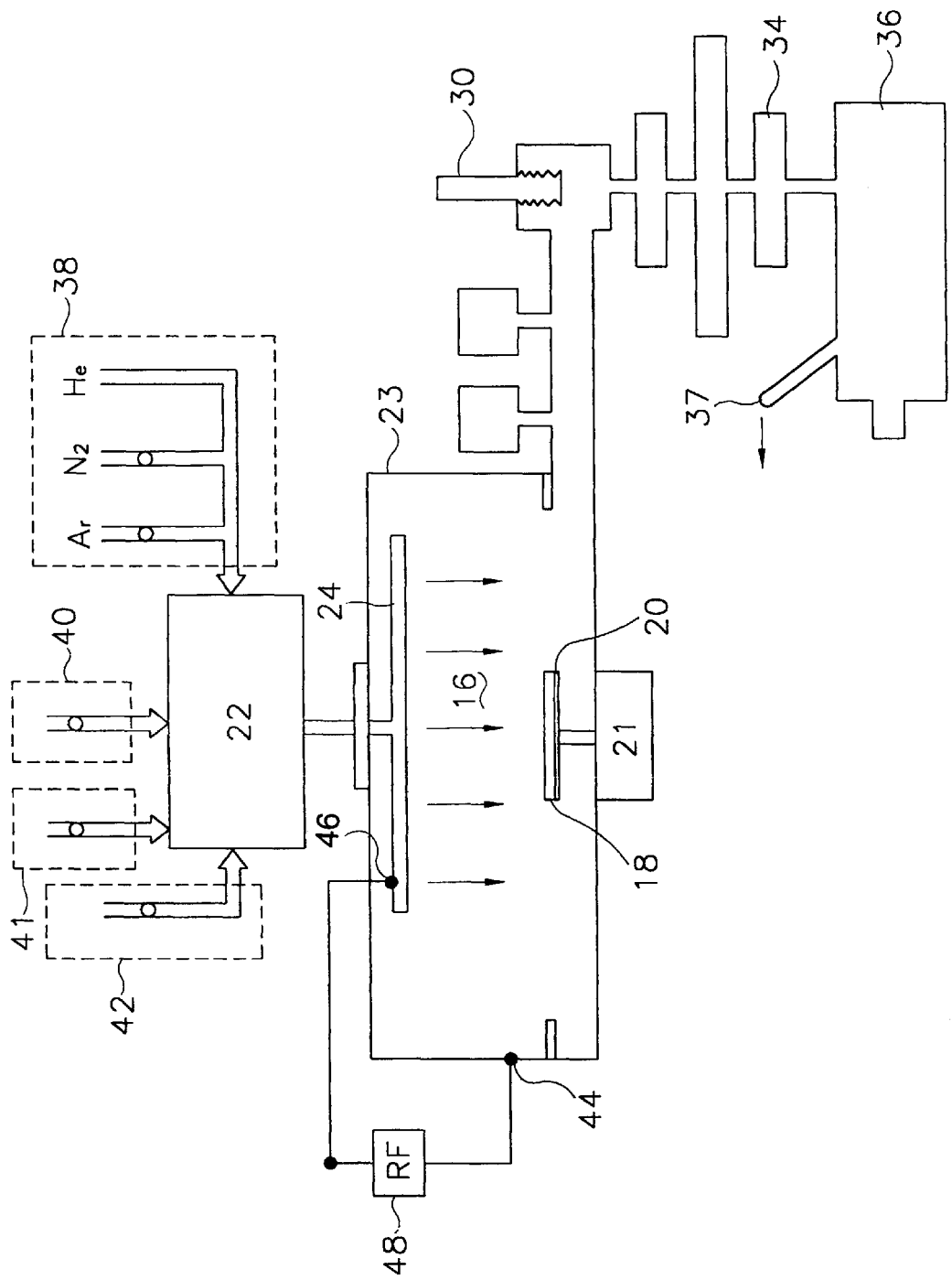
FIG. 3 is a schematic view showing a chemical vapor deposition apparatus which may be used to perform a method according to one or more embodiments of the present invention.

FIG. 3 is a schematic view of a cool wall type plasma enhanced chemical vapor deposition (PECVD) device which may be used to perform a method according to one or more embodiments of the present invention.

Referring to FIG. 3, the PECVD device has a process chamber 23, a susceptor 20 which is positioned in the process chamber 23 and on which a semiconductor substrate 18, such as a silicon wafer is placed, a heater 21 installed below the susceptor 20 for heating the semiconductor substrate 18 at a constant temperature, a pressure control section 30 for applying a pressure to the process chamber 23 and for controlling the pressure, gas lines (unnumbered) for supplying reaction gases 40, 41 and 42 into the process chamber 23, and an RF power source 48.

The heater 21 may include, for example, a halogen lamp or a ceramic heater, and the pressure control section 30 may include a vacuum pump (not shown).

The gas lines may be equipped with mass flow controller (MFC) valves for adjusting a flow rate and an amount of the gases, and the reaction gases may be supplied into a mixing chamber 22 through such valves.

Reaction gases 40, 41 and 42 and an inert carrier gas 38 are mixed in the mixing chamber 22 and then supplied into the process chamber 23 through a shower head 24. At this time, the reaction gases supplied through the shower head 24 are glow-discharged by two electrodes 44 and 46 connected to the RF power source 48, so that the reaction gases are converted into a plasma. A mixed gas 16 converted into the plasma gas is supplied onto a surface of the semiconductor substrate and thus a layer is deposited on the semiconductor substrate. Non-reacted gas is guided into a filter 36 via a blow mechanism 34 and is exhausted to the exterior through an exhaust line 37.

Figure 4:
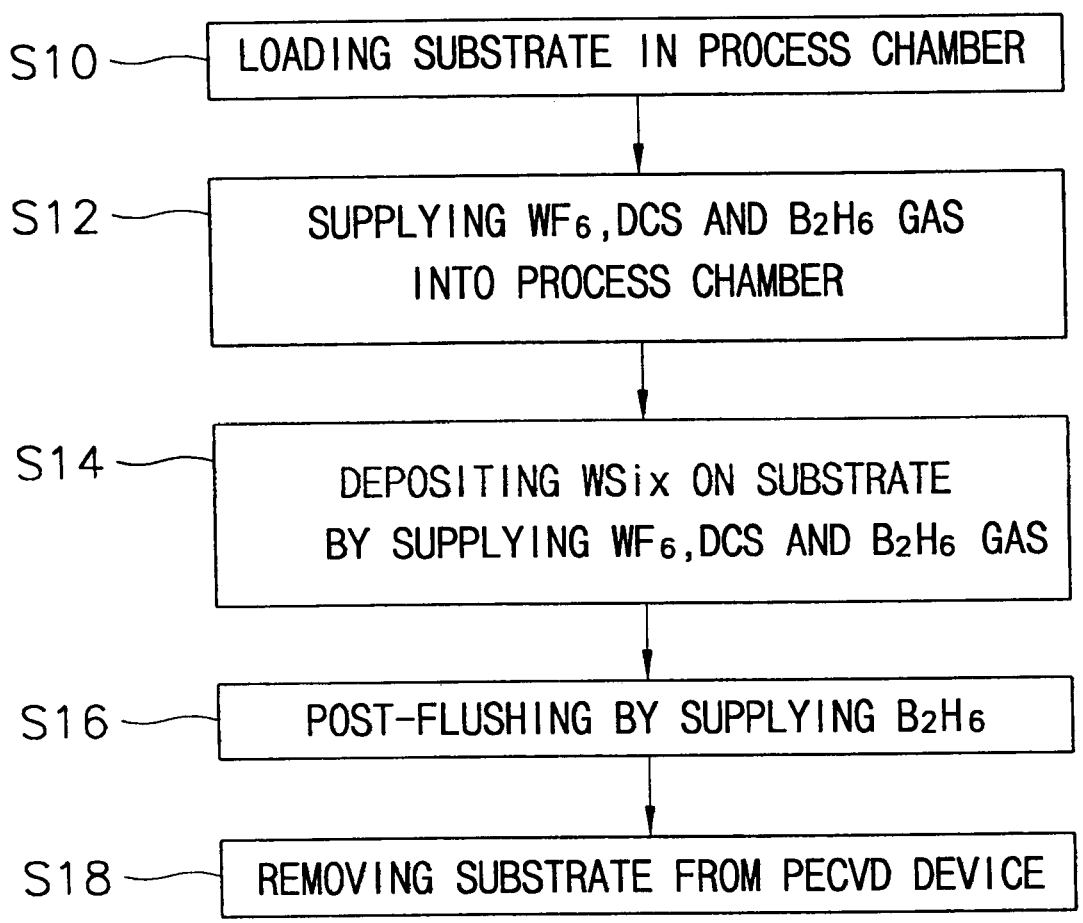
FIG. 4 is a flow chart of a method for depositing a tungsten silicide layer according to a first embodiment of the present invention.

FIG. 4 is a flow chart for explaining a method for depositing the tungsten silicide layer according to the first embodiment of the present invention. Referring to FIG. 3 as well, a semiconductor substrate 18 having a polysilicon layer on an uppermost layer thereof is loaded in a cassette of a loadlock chamber (not shown) of the PECVD device. Then, the pressure of the loadlock chamber is pumped up to 200 mTorr to maintain the loadlock chamber in a vacuum state. The semiconductor substrate 18 is transferred onto the susceptor 20 in the process chamber 23 by means of a conveying device, such as a robot arm (step S10).

Then, the heater 21 is used to heat the semiconductor substrate 18 to a temperature of about 450 to 700° C., preferably to a temperature of about 500 to 600° C. At this time, the pressure in the process chamber 23 is maintained at about 1000 to 1500 mTorr. The temperature of the semiconductor substrate 18 has an important impact on the uniformity of a layer formed thereon and the growth rate of the layer. Particularly, when the deposition temperature of the tungsten silicide ascends, the content of chlorine in the thin film increases. As the content of chlorine increases, a surface tension of the tungsten silicide layer is weakened. The surface tension effects the step coverage of the layer, making it necessary to precisely control the temperature of the semiconductor substrate 18. In addition, in order to allow the reaction gases 40, 41, and 42 to be easily converted into the plasma gas or to be easily ionized, the pressure in the process chamber 23 needs to be lowered to a vacuum pressure.

Then, a tungsten source gas 40 at a flow rate of 13 sccm, a silicon source gas 42 at a flow rate of 180 sccm, and a hydrogen compound gas at a flow rate of 10 sccm, are mixed in the mixing chamber 22 together with an inert carrier gas 38. The thus mixed gas 16 is introduced into the process chamber 23 through the shower head 24 (step S12). At this time, the amount of the silicon source gas 42 is adjusted in consideration of temperature conditions such that the composition ratio of the layer is $WSi_x$ (x=2). Preferably, the tungsten source gas 40, the silicon source gas 42, and the hydrogen compound gas 41 are supplied in a ratio of about 1:14:1. According to the present embodiment, 5 to 30 sccm of the tungsten source gas 40 is supplied, 150 to 200 sccm of the silicon source gas 42 is supplied, and 5 to 100 sccm of the hydrogen compound gas 41 is supplied.

The tungsten source gas may be a tungsten hexafluoride ($WF_6$) gas, and the silicon source gas 42 may be a dichlorosilane ($SiH_2Cl_2$) gas. In addition, the silicon source gas 42 may be a dimethyl dichlorosilane (DMDCS) gas or a trimethyl chlorosilane (TMCS) gas. These source gases may be used individually or as a mixture thereof. The inert carrier gas 38 may be an argon gas, a nitrogen gas or a helium gas. These inert carrier gases may also be used individually or as a mixture thereof.

While the tungsten silicide layer is being deposited, the hydrogen compound gas 41 prevents the chlorine radical, which is dissociated from the dichlorosilane gas 42, from being bonded to silicon to form a $SiCl_x$ crystal, and further prevents the chlorine radicals from interacting with each other. That is, the hydrogen compound gas 41 reduces the chlorine radical generated from the dichlorosilane gas 42 into hydrogen chloride (HCl) so that the chlorine radical can be exhausted to the exterior together with the exhaust gas. The hydrogen compound gas 41 may be, for example, $B_2H_6$, $PH_3$, $AsH_3$ and/or $NH_3$. Preferably, a hydrogen compound gas including boron (B), phosphorous (P), or arsenic (As), which acts as a dopant in the tungsten silicide layer, is used. For example, when the $B_2H_6$ gas is adopted as the hydrogen compound gas 41, the boron (B) thereof acts as a p-type dopant in the tungsten silicide layer, so that a low Fermy level, that is, an acceptor level is created, thereby increasing hole density. As a result, the specific resistivity of the tungsten silicide layer can be lowered. Likewise, when the $PH_3$ gas is adopted as the hydrogen compound gas 41, the phosphorous (P) thereof acts as an n-type dopant in the tungsten silicide layer, so that the density of electrons is increased, thereby lowering the specific resistivity of the tungsten silicide layer.

Thereafter, RF power is applied to the process chamber 23 through the RF power source 48. As the RF power is applied to the process chamber 23, the mixed gas 16 injected into the process chamber 23 is glow-discharged through two electrodes 44 and 46, so that the mixed gas 16 is dissociated or ionized. The dissociated or ionized mixed gas 16 is bonded to the surface of the semiconductor substrate 18, thereby depositing the tungsten silicide layer on the semiconductor substrate 18 (step S14). At this time, the chlorine radicals dissociated from the dichlorosilane gas 42 are reduced into hydrogen chloride by the hydrogen compound gas 41, for example $B_2H_6$ gas, whereby these chlorine radicals are not present in the tungsten silicide layer.

Then, after turning off the RF power, a post-flushing process is carried out with respect to the surface of the tungsten silicide layer by supplying the hydrogen compound gas 41, for example $B_2H_6$ gas, into the process chamber 23 at a flow rate of 120 sccm for 70 to 120 seconds (step S16). The post-flushing process is carried out so as to release stress and prevent the chlorine radicals from being bonded to the surface of the tungsten silicide layer.

Next, the pressure in the process chamber 23 is pumped up to 20 mTorr to form a high vacuum state in the process chamber 23 and the semiconductor substrate 18 is conveyed into the loadlock chamber by means of the conveying device. When the wafers have been loaded in the cassette in the loadlock chamber, a vent gas, such as nitrogen or argon, is supplied to the loadlock chamber through a vent line connected to the loadlock chamber until the pressure in the loadlock chamber reaches 760 Torr. Then, the loadlock chamber is vented so that wafers may be removed from the PECVD device (step S18).

According to the first embodiment of the present invention, the hydrogen compound gas, such as $B_2H_6$ gas, which is capable of reducing a chlorine radical, is introduced into the process chamber when the tungsten silicide layer is deposited. Therefore, the chlorine radical dissociated from the dichlorosilane gas is reduced into hydrogen chloride (HCl) by the hydrogen compound gas and is exhausted to the exterior together with an exhaust gas. As a result, chlorine is not bonded to silicon in the tungsten silicide layer, thereby avoiding the formation of $SiCl_x$ crystals in the tungsten silicide. Accordingly, it is possible to avoid the visual defects (that is, the Milky Way phenomenon) caused by the $SiCl_x$ crystals, and to avoid the abnormal growth (that is, the haze phenomenon) of the lower polysilicon layer caused by diffusion of the $SiCl_x$ crystals.

In addition, since the $B_2H_6$ gas and the $PH_3$ gas contains boron and phosphorous, respectively, which act as a dopant in the tungsten silicide layer, the specific resistivity of the tungsten silicide layer can be lowered.

Figure 5:
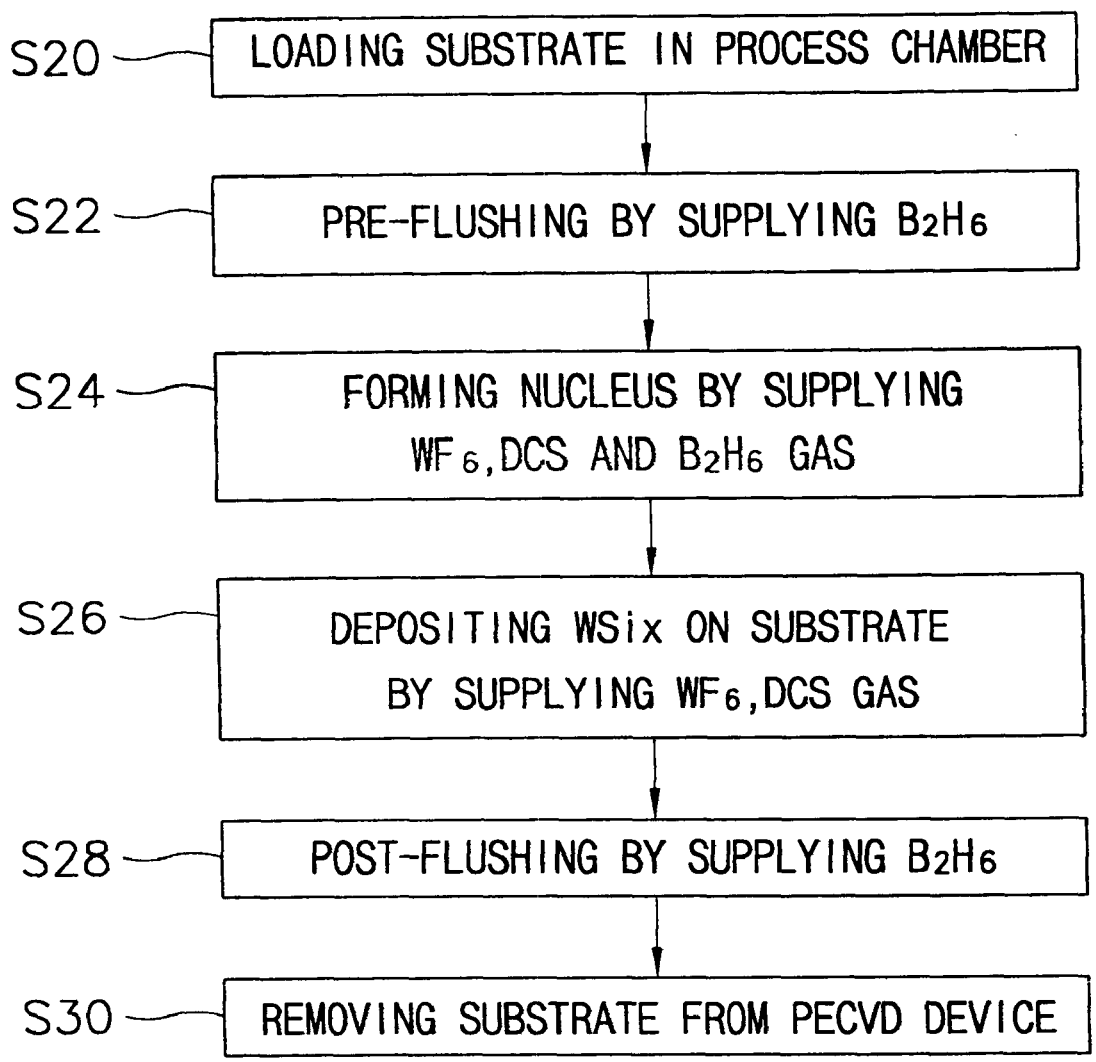
FIG. 5 is a flow chart of a method for depositing a tungsten silicide layer according to a second embodiment of the present invention.

FIG. 5 is a flow chart of a method for depositing a tungsten silicide layer according to a second embodiment of the present invention.

Referring to FIG. 5, the semiconductor substrate having a polysilicon layer at an uppermost region thereof is loaded on a susceptor in a process chamber (step S20). Then, the semiconductor substrate is heated to a temperature of about 450 to 700° C., preferably to a temperature of about 500 to 600° C., and the pressure in the process chamber is maintained at about 1000 to 1500 mTorr. While maintaining such pressure and temperature conditions, a pre-flushing process is carried out with respect to the surface of the polysilicon layer by introducing a hydrogen compound gas, for example the $B_2H_6$ gas, into the process chamber at a flow rate of about 120 sccm for about 60 seconds (step S22). The pre-flushing process is carried out to release stress and to promote nucleation. According to the present embodiment, $B_2H_6$ is adhered to the surface of the polysilicon by performing the pre-flushing process using the $B_2H_6$ gas.

Then, a mixed gas is introduced into the chamber and includes tungsten hexafluoride ($WF_6$) at a flow rate of about 1 sccm, dichlorosilane ($SiH_2Cl_2$) at a flow rate of about 300 sccm, $B_2H_6$ at a flow rate of about 60 sccm, and argon at a flow rate of about 20 sccm. RF power is then applied to the process chamber to form a plasma reaction of the mixed gas such that a silicide nucleus having a thickness of no more than about 200 Å is deposited on the surface of the polysilicon layer (step S24). At this time, the chlorine radical dissociated from the dichlorosilane gas is reduced into hydrogen chloride by reacting with a hydrogen radical adhered to the surface of the polysilicon layer. In this manner, the chlorine radical can be exhausted to the exterior of the process chamber together with the exhaust gas. Accordingly, chlorine is not accumulated in the polysilicon layer.

Next, the tungsten hexafluoride ($WF_6$) gas at a flow rate of about 13 sccm, the dichlorosilane ($SiH_2Cl_2$) gas at a flow rate of about 180 sccm, and the argon gas at a flow rate of about 200 sccm are introduced into the process chamber such that the tungsten silicide layer is deposited by plasma reaction on the polysilicon layer to a thickness of about 1000 Å (step S26).

Then, the RF power is turned off and the post-flushing process is carried out with respect to the surface of the tungsten silicide layer by supplying the $B_2H_6$ gas into the process chamber at a flow rate of about 120 sccm for about 70 to 120 seconds (step S28). The post-flushing process is carried out so as to release stress and further prevent the chlorine radical from bonding to the surface of the tungsten silicide layer.

Thereafter, the semiconductor substrate is conveyed into the loadlock chamber of the PECVD device and is removed from the PECVD device upon venting the loadlock chamber (step S30).

Figure 6:
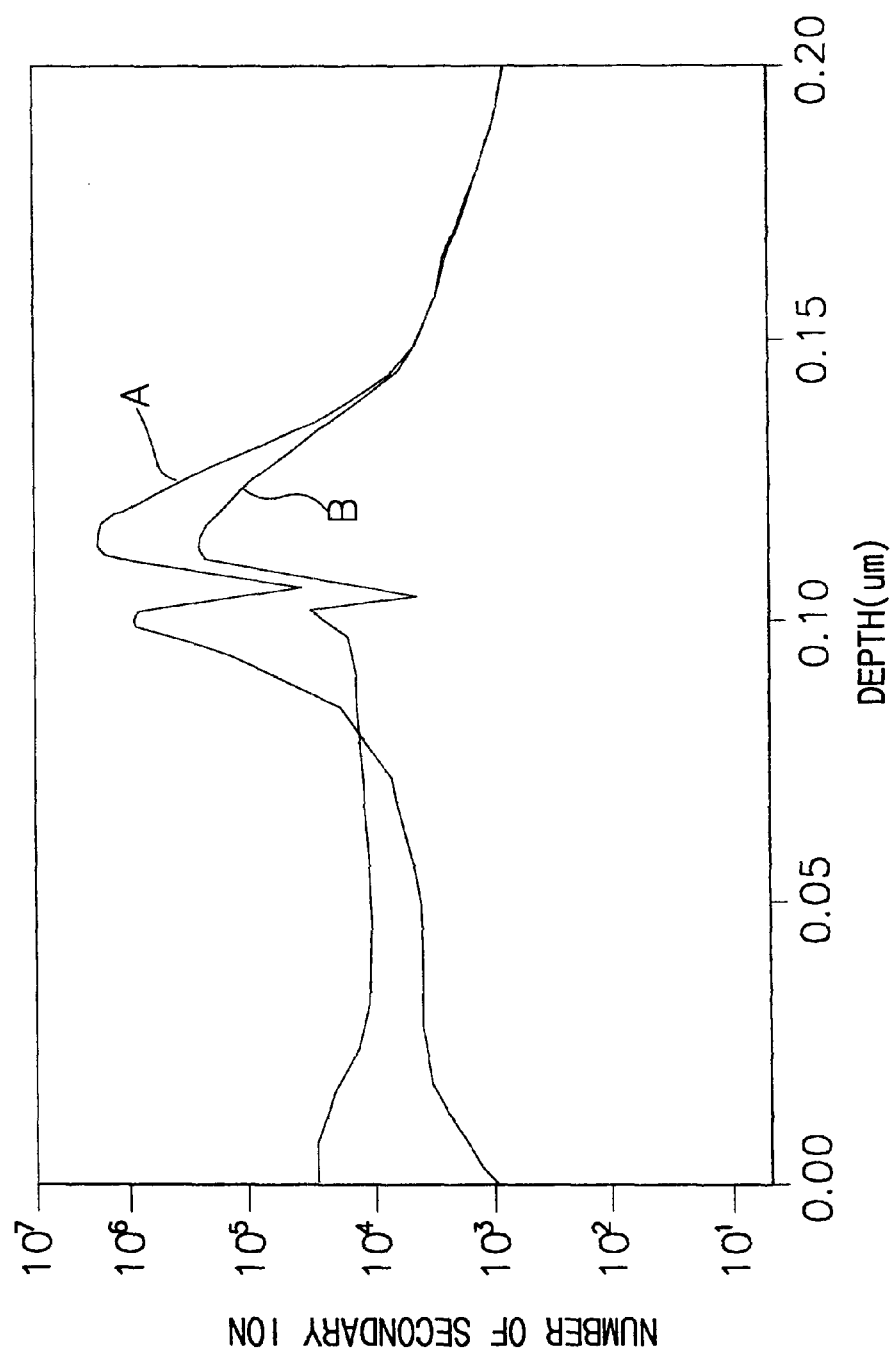
FIG. 6 is a graph showing a chlorine profile contained in a tungsten silicide and a polysilicon layer according to the second embodiment of the present invention.

FIG. 6 is a graph showing a chlorine profile in the tungsten silicide layer and the polysilicon layer according to the second embodiment of the present invention. The line A represents a chlorine profile in the tungsten silicide layer and the polysilicon layer according to the conventional DCS tungsten silicide layer deposition method. The line B represents the chlorine profile in the tungsten silicide layer and the polysilicon layer according to deposition method of the present invention, in the case were $PH_3$ gas was used as the hydrogen compound gas. After pre-flushing the surface of the polysilicon layer using the $PH_3$ gas, a nucleation process was carried out for about 20 seconds by mixing the $PH_3$ gas with tungsten hexafluoride gas and dichlorosilane gas.

As can be seen from the graph of FIG. 6, when the nucleation process was carried out by introducing the $PH_3$ gas after pre-flushing the surface of the polysilicon layer using the $PH_3$ gas, the density of chlorine was reduced at both sides of an interfacial surface between the tungsten silicide layer and the polysilicon layer.

That is, when the nucleation process is carried out after adhering $PH_3$ onto the surface of the polysilicon layer, the chlorine radical generated from the dichlorosilane gas is reacted with the hydrogen radical adhering to the surface of the polysilicon layer so that the chlorine radical is reduced into hydrogen chloride. Accordingly, chlorine tends not to stack in the polysilicon layer, and thus the density of chlorine is reduced within and at the surface of the polysilicon layer.

FIG. 7 is a flow chart of a method for depositing a tungsten silicide layer according to a third embodiment of the present invention.

Referring to FIG. 7, the semiconductor substrate having a polysilicon layer at an uppermost region thereof is loaded on a susceptor in a process chamber (step S50). Then, the semiconductor substrate is heated to a temperature of about 450 to 700° C., preferably to a temperature of about 500 to 600° C., and the pressure in the process chamber is maintained at about 1000 to 1500 mTorr.

While maintaining the above pressure and temperature, a pre-flushing process is carried out with respect to the surface of the polysilicon layer by introducing a hydrogen compound gas, for example $B_2H_6$ gas, into the process chamber at a flow rate of about 120 sccm for 60 seconds (step S52). The pre-flushing process is carried out to release stress and to promote nucleation. According to the present embodiment, $B_2H_6$ is adhered to the surface of the polysilicon silicon by performing pre-flushing using the $B_2H_6$ gas.

Then, a mixed gas is introduced into the chamber which includes tungsten hexafluoride ($WF_6$) at a flow rate of about 1 sccm, dichlorosilane ($SiH_2Cl_2$) at a flow rate of about 300 sccm, $B_2H_6$ at a flow rate of about 60 sccm, and argon at a flow rate of about 20 sccm. RF power is then applied to the process chamber to form a plasma reaction of the mixing gas such that a silicide nucleus having a thickness of no more than about 200 Å is deposited on the surface of the polysilicon layer (step S54). At this time, the chlorine radical dissociated from the dichlorosilane gas is reduced into hydrogen chloride by reaction with a hydrogen radical adhered to the surface of the polysilicon layer. In this manner, the chlorine radical may be exhausted to the exterior of the process chamber together with the exhaust gas. Accordingly, chlorine does not accumulate in the polysilicon layer.

Next, introduced into the process chamber are the tungsten hexafluoride ($WF_6$) gas at a flow rate of about 13 sccm, the dichlorosilane ($Si_2HCl_2$) gas at a flow rate of about 180 sccm, the $B_2H_6$ gas at a flow rate of about 10 sccm, and the argon gas at a flow rate of about 200 sccm. A tungsten silicide layer is thereby deposited on the polysilicon layer to a thickness of about 1000 Å by plasma reaction of the afore-mentioned gases (step S56). A chlorine radical dissociated from the dichlorosilane gas is reduced into hydrogen chloride (HCl) by the $B_2H_6$ gas and is exhausted to the exterior together with the exhaust gas, whereby the exhausted chlorine radical is not present in the tungsten silicide layer. In addition, boron (B) contained in the $B_2H_6$ gas acts as a p-type dopant in the tungsten silicide layer, thus increasing hole density and decreasing specific resistivity of the tungsten silicide layer.

Then, the RF power is turned off and the post-flushing process is carried out with respect to the surface of the tungsten silicide layer by supplying the $B_2H_6$ gas into the process chamber at a flow rate of about 120 sccm for 70 to 120 seconds (step S58). The post-flushing process is carried out so as to release stress and further prevent the chlorine radical from being bonded to the surface of the tungsten silicide layer.

Thereafter, the semiconductor substrate is conveyed into the loadlock chamber of the PECVD device and is removed from the PECVD device upon venting the loadlock chamber (step S60).

As described above, according to the method of depositing a tungsten silicide layer of the present invention, a hydrogen compound gas, such as $B_2H_6$ gas, $PH_3$ gas, $AsH_3$ gas or $NH_3$ gas, is introduced into the process chamber of the PECVD device together with a tungsten source gas, such as tungsten hexafluoride ($WF_6$) gas, and a silicon source gas, such as dichlorosilane ($SiH_2Cl_2$) gas. A chlorine radical of the silicon source gas is reduced into hydrogen chloride by the hydrogen compound gas so that it can be exhausted to the exterior together with an exhaust gas. Therefore, visual defects caused by $SiCl_x$ crystals and the abnormal growth of the lower polysilicon layer caused by the diffusion of the $SiCl_x$ crystals can be avoided.

In addition, when the $B_2H_6$, $PH_3$, and $AsH_3$ gases are used as the hydrogen compound gas, the boron, phosphorous or arsenic contained in these gases acts as a p-type dopant or an n-type dopant in the tungsten silicide layer, thereby increasing the electron density or hole density. Accordingly, the specific resistivity of the tungsten silicide layer can be reduced.

While the present invention has been described in detail with reference to the preferred embodiment thereof, it should be understood to those skilled in the art that various changes, substitutions and alterations can be made hereto without departing from the scope of the invention as defined by the appended claims.

What is claimed is:

1. A method for forming a tungsten silicide layer, comprising:
   loading a semiconductor substrate having a polysilicon layer into a process chamber of a plasma enhanced chemical vapor deposition device; and
   introducing a silicon source gas, a tungsten source gas, and a hydrogen compound gas into the process chamber so as to deposit a tungsten silicide layer on the polysilicon layer, wherein the silicon source gas includes chlorine, wherein the hydrogen compound comprises at least one of $B_2H_6$, $PH_3$, $AsH_3$ and $NH_3$, and wherein a chlorine radical of the silicon source gas is reduced by a hydrogen radical of the hydrogen compound gas.

2. The method as claimed in claim 1, wherein the chlorine radical is reduced to a hydrogen chlorine compound, and wherein the method further comprises exhausting the hydrogen chlorine compound from the process chamber.

3. The method as claimed in claim 1, wherein the silicon source gas comprises at least one of dichlorosilane ($SiH_2Cl_2$), dimethyl dichlorosilane (DMDCS), and trimethyl chlorosilane (TMCS).

4. The method as claimed in claim 1, wherein the tungsten source gas includes a tungsten hexafluoride ($WF_6$) gas.

5. The method as claimed in claim 1, wherein the tungsten silicide layer is deposited at a temperature of about 450 to 700° C., and under a pressure of about 1000 to 1500 mTorr.

6. The method as claimed in claim 1, wherein the tungsten source gas, the silicon source gas, and the hydrogen compound gas are supplied in a ratio of about 1:14:1.

7. The method as claimed in claim 6, further comprising, after depositing the tungsten silicide layer, performing a post-flushing process with respect to a surface of the tungsten silicide layer by introducing the hydrogen compound gas into the process chamber.

8. The method as claimed in claim 6, wherein the chemical vapor deposition device is a cold wall type chemical vapor deposition device.

9. A method for forming a tungsten silicide layer, comprising:
   loading a semiconductor substrate having a polysilicon layer into a process chamber of a plasma enhanced chemical vapor deposition device;
   pre-flushing a surface of the polysilicon layer by introducing a hydrogen compound gas into the process chamber;
   introducing a silicon source gas, a tungsten source gas and the hydrogen compound gas into the process chamber so as to form a tungsten silicide nucleus on the surface of the polysilicon layer; and
   introducing the silicon source gas and the tungsten source gas into the process chamber so as to deposit a tungsten silicide layer on the polysilicon layer,
   wherein the silicon source gas includes chlorine, and wherein a chlorine radical of the silicon source gas is reduced by a hydrogen radical of the hydrogen compound gases.

10. The method as claimed in claim 9, wherein the chlorine radical is reduced to a hydrogen chlorine compound, and wherein the method further comprises exhausting the hydrogen chlorine compound from the process chamber.

11. The method as claimed in claim 9, wherein the silicon source gas comprises at least one of dichlorosilane ($SiH_2Cl_2$), dimethyl dichlorosilane (DMDCS), and trimethyl chlorosilane (TMCS).

12. The method as claimed in claim 9, wherein the tungsten source gas includes a tungsten hexafluoride ($WF_6$) gas.

13. The method as claimed in claim 9, wherein the second hydrogen compound gas comprises at least one of $B_2H_6$, $PH_3$, $AsH_3$ and $NH_3$.

14. The method as claimed in claim 9, wherein the tungsten source gas, the silicon source gas, and the hydrogen compound gas are supplied in a ratio of about 1:14:1.

15. The method as claimed in claim 9, further comprising, after depositing the tungsten silicide layer, performing a post-flushing process with respect to a surface of the tungsten silicide layer by introducing the hydrogen compound gas into the process chamber.

16. A method for forming a tungsten silicide layer, comprising:
   loading a semiconductor substrate having a polysilicon layer into a process chamber of a plasma enhanced chemical vapor deposition device;
   pre-flushing a surface of the polysilicon layer by introducing a hydrogen compound gas into the process chamber;
   introducing a silicon source gas, a tungsten source gas and the hydrogen compound gas into the process chamber so as to form a tungsten silicide nucleus on the surface of the polysilicon layer; and
   introducing the silicon source gas, the tungsten source gas, and the hydrogen compound gas into the process chamber so as to deposit a tungsten silicide layer on the polysilicon layer,
   wherein the silicon source gas includes chlorine, and wherein a chlorine radical of the silicon source gas is reduced by a hydrogen radical of the hydrogen compound gas.

17. The method as claimed in claim 16, wherein the chlorine radical is reduced to a hydrogen chlorine compound, and wherein the method further comprises exhausting the hydrogen chlorine compound from the process chamber.

18. The method as claimed in claim 16, wherein the silicon source gas comprises at least one of dichlorosilane ($SiH_2Cl_2$), dimethyl dichlorosilane (DMDCS), and trimethyl chlorosilane (TMCS).

19. The method as claimed in claim 16, wherein the tungsten source gas includes a tungsten hexafluoride ($WF_6$) gas.

20. The method as claimed in claim 16, wherein the hydrogen compound comprises at least one of $B_2H_6$, $PH_3$, $AsH_3$ and $NH_3$.

21. The method as claimed in claim 16, wherein the tungsten source gas, the silicon source gas, and the hydrogen compound gas are supplied in a ratio of about 1:14:1.

22. The method as claimed in claim 16, wherein the tungsten silicide layer is deposited at a temperature of about 450 to 700° C., and under a pressure of about 1000 to 1500 mTorr.

23. The method as claimed in claim 16, further comprising, after depositing the tungsten silicide layer, performing a post-flushing process with respect to a surface of the tungsten silicide layer by introducing the hydrogen compound gas into the process chamber.

* * * * *